US006661289B2

(12) United States Patent
Sato et al.

(10) Patent No.: US 6,661,289 B2

(45) Date of Patent: Dec. 9, 2003

(54) VOLTAGE-TO-CURRENT CONVERSION CIRCUIT AND OTA USING THE SAME

(75) Inventors: Takahide Sato, Tokyo (JP); Nobuo Fujii, Tokyo (JP); Sigetaka Takagi, Tokyo (JP); Kazuyuki Wada, Toyohashi (JP)

(73) Assignee: Semiconductor Technology Academic Research Center, Yokohama (JP)

( * ) Notice: Subject to any disclaimer, the term of this patent is extended or adjusted under 35 U.S.C. 154(b) by 0 days.

(21) Appl. No.: 10/176,063

(22) Filed: Jun. 21, 2002

(65) Prior Publication Data

US 2003/0071603 A1 Apr. 17, 2003

(30) Foreign Application Priority Data

Oct. 17, 2001 (JP) ....................................... 2001-319760

(51) Int. Cl.[7] ................................................ H03F 3/16

(52) U.S. Cl. ....................................... 330/277; 330/253

(58) Field of Search ................................ 330/253, 255, 330/277, 257, 250

(56) References Cited

U.S. PATENT DOCUMENTS 4,897,612 A * 1/1990 Carroll ....................... 330/253
5,208,552 A * 5/1993 Ryat ........................... 330/253

OTHER PUBLICATIONS

Li, M.F. et al., "A Low–Voltage CMOS OTA with Rail–to–Rail Differential Input Range", IEEE Transactions on Circuits and Systems Part 1: Fundemental Theory and Applications, vol. 47, No. 1, pp. 1–8, (2000), No month.

Takai, N. et al., "Rail–to–Rail OTA using Transconductance–Parameter–independent OTA", ECT–00–94, pp. 73–78, (2000), No month.

Takai, N. et al., "Transconductance–Parameter–Independent OTA and its application to Rail–to–Rail circuit", IEEJ International Analog VLSI Workshop, pp. 37–40 (2001), No month.

Sato, T. et al., "Rail–to–Rail OTA Using One Kind MOSFET's as a VCCS", ECT–00–95, pp. 79–84, (2000), No month.

Sato, T. et al., Operational Transconductance Amplifier with Rail–to–Rail Input Stage Using Single Channel Type MOSFETs, IEICE Trans. Fundamentals, vol. E85–A, No. 2, pp. 354–359, Feb. (2002).

Wada, K. et al., "Realization of MOSFETs' Characteristics without Cutoff Region", ECT–99–113, pp. 19–24, (1999), No month.

Wada, K. et al., "Wide–Input Range Linear Voltage–to–Current Converter Using Equivalent MOSFETs without Cutoff Region", IEICE Trans. Fundamentals, vol. E85–A, No. 2, pp. 347–353, Feb. (2002).

* cited by examiner

*Primary Examiner*—Shawn Riley
(74) *Attorney, Agent, or Firm*—Finnegan, Henderson, Farabow, Garrett & Dunner, L.L.P.

(57) ABSTRACT

A voltage-to-current conversion circuit composed of MOSFETs of the same polarity and an OTA with Rail-to-Rail with a simple configuration that uses the same have been disclosed. The voltage-to-current conversion circuit comprises a first MOSFET, to which a fixed drain-source voltage is applied all the time, and which generates a first current signal for an input voltage, a second MOSFET, which has the same polarity as that of the first MOSFET, to which the fixed drain-source voltage is applied all the time, and which generates a second current signal complementary to the first current signal for the input voltage, and a difference current operation circuit that performs the operation of subtraction between the first current signal and the second current signal, thereby an output current is generated in accordance with the input voltage.

8 Claims, 19 Drawing Sheets

VOLTAGE-TO-CURRENT CONVERSION CIRCUIT AND OTA USING THE SAME

BACKGROUND OF THE INVENTION

The present invention relates to a Rail-to-Rail voltage-to-current conversion circuit, comprising MOSFETs, and in which the linear operating range has been extended to the power source range, and an OTA (Operational Transconductance Amplifier) using the same. More particularly, the present invention relates to a voltage-to-current conversion circuit, in which the transconductance is kept constant by using two MOSFETs of the same polarity, and an OTA using the same.

Recently, it has become important to reduce the voltage of the power source of an analog integrated circuit composed of MOSFETs, from the general requirements of the reduction in power consumption of semiconductor integrated circuits and in withstand voltage of devices.

An analog-to-digital hybrid circuit is an integrated circuit that is expected to be widely used in the future. In a digital circuit, the power consumption is in proportion to the second power of the power source voltage to be supplied to the circuit and, therefore, reduction in power source voltage is an effective approach to reduce the power consumption. As a result, there is a trend that the power source voltage of a digital circuit is lowered year after year. As the power source voltage of a digital circuit is lowered, that of the part of an analog circuit composed of MOSFETs, which is realized on the same chip, is required to be lower. On the other hand, as the signal processing becomes more complicated, the operating speed of an integrated circuit increases, the semiconductor process becomes finer in order to enable a higher speed operation, and as a result, the withstand voltage of a device is lowered. Therefore, the reduction in power source voltage becomes an unavoidable issue in an integrated circuit using a high-speed processor.

Generally, the reduction in power source voltage in an analog integrated circuit causes a problem that the linear range of an input signal is reduced. Various Rail-to-Rail circuits, in which the linear range of input signal has been extended to that of the positive and negative power source voltage, have been proposed as circuit configurations to solve this problem.

Among the fundamental circuit elements in an analog circuit composed of MOSFETs, there are the voltage-to-current conversion circuit that generates an output current in accordance with an input voltage and the OTA (Operational Transconductance Amplifier) using same. FIG. 1 is a diagram that shows circuit symbols of an OTA. An OTA circuit 1 puts out an output current Iout in accordance with the difference between two input voltages Vin1 and Vin2. For the above-mentioned voltage-to-current conversion circuit and OTA, the Rail-to-Rail circuit has been proposed.

FIG. 2 is a diagram that shows the configuration of the Rail-to-Rail OTA circuit, which has been disclosed in M. F. Li, U. Dasgupta, X. W. Zhang, Y. C. Lim, "A low-Voltage CMOS OTA with Rail-to-Rail Differential Input Range", IEEE Trans. Circuit and Systems 1, vol. 47, pp. 1–8, January 2000. As shown schematically, the OTA circuit has extended the linear input range by using in parallel a pOTA circuit 1*p* composed of a p channel MOSFET and an nOTA circuit 1*n* composed of an n channel MOSFET. In this circuit, however, which uses a p channel MOSFET and an n channel MOSFET, the matching of the transconductances of transistors of different polarity is required in order to achieve a linear characteristic.

Takai, Watanabe, Takagi, Fujii, "Rail-to-Rail OTA using Transconductance-Parameter-independent OTA", ECT-00-94, pp. 73–78, October 2000 has disclosed the configuration in which the transconductance of two input circuits is kept constant by the control voltage generated by using circuits similar to those of the two input circuits, and furthermore, the influence of the operation at the point where the operations of the two input circuits switch is suppressed by using a current selection circuit.

Moreover, Sato, Takagi, Fujii, "Rail-to-Rail OTA using One kind MOSFET's as VCCS", ECT-00-95, pp. 79–84, October 2000 has disclosed the OTA that has combined a pair of MOSFETs and a MOSFET of the same polarity. Since the OTA is composed of MOSFETs of the same polarity, there is no problem about the matching of transconductances.

SUMMARY OF THE INVENTION

The object of the present invention is to realize a voltage-to-current conversion circuit composed of MOSFETs of the same polarity, which can realize an OTA with Rail-to-Rail with a simpler configuration.

FIG. 3 is a diagram that shows the basic configuration of the voltage-to-current conversion circuit of the present invention. As shown schematically, the voltage-to-current conversion circuit of the present invention is characterized by comprising a first MOSFET 11, to which a fixed drain-source voltage is applied all the time and which generates a first current signal ID1 for the input voltage, a second MOSFET 12, which has the same polarity as that of the first MOSFET 11, to which the fixed drain-source voltage is applied all the time, and which generates a second current signal ID2 for the input voltage, which is complementary to the first current signal ID1, and a difference current operation circuit 13 that performs the operation to calculate the difference between the first current signal ID1 and the second current signal ID2.

The first MOSFET 11 and the second MOSFET 12 can each be an n channel type or a p channel type as long as they have the same polarity.

There are various modifications for the method to make the first MOSFET 11 and the second MOSFET 12 operate so as to generate current signals complementary to each other. FIG. 4A is a diagram that shows the basic configuration in which the sources of the first MOSFET 11 of n channel type and the second MOSFET 12 of n channel type are grounded and a fixed voltage is applied to each drain, and FIG. 4B is a diagram that shows the voltage-to-current characteristics of the two MOSFETs.

In this basic configuration, the sources of the first MOSFET 11 and the second MOSFET 12 are grounded, respectively, as shown in FIG. 4A, and a voltage VDS is applied to each drain. An input voltage Vin is applied to the gate of the first MOSFET 11. A gate voltage generation circuit 14 generates and applies a voltage 2VT+VDS−Vin to the gate of the second MOSFET 12. Here, VT is the threshold voltage of the MOSFET.

First, the variation characteristic of the current ID1 versus the input voltage Vin of the first MOSFET 11 is described. The operation of the MOSFET can be divided into three regions according to the relationship between a drain-source voltage VDS and a gate-source voltage VGS, as shown in FIG. 4B, and a drain current ID in each region is as follows.

Cutoff region: VGS≦VT
ID=0

Saturation region: VT<VGS, VGS−VT<VDS
ID=K $(VGS-VT)^2$

Non-saturation region: VT<VGS, VDS<VGS−VT
ID=2K (VGS−VT−VDS/2) VDS

Therefore, if the gate-source voltage is assumed to be the input voltage Vin, the linear relationship between the input voltage and the drain current holds only in the non-saturation region.

Since the voltage 2VT+VDS−Vin is applied to the gate of the second MOSFET 12 in FIG. 4A, the drain current ID2 changes as shown in FIG. 4B for the input voltage Vin. In other words, the current characteristic is so established that the drain current ID2 and the drain current ID1 are symmetrical with respect to the symmetry axis at which the input voltage is VT+VDS/2. Such a relationship between the first MOSFET 11 and the second MOSFET 12 is referred to as the complementary action to each other here, and ID1 and ID2 are referred to as the currents complementary to each other.

Therefore, the difference current IO, which is obtained by subtracting the drain current ID2 of the second MOSFET 12 from the drain current ID1 of the first MOSFET 11, is as follows in each region.

Region A: Vin≦VT
First MOSFET 11: Cutoff region, ID1=0
Second MOSFET 12: Non-saturation region
ID2=−2K·VDS·Vin+K (VDS+2VT) VDS
IO=2K·VDS·Vin−K (VDS+2VT) VDS Region B: VT<Vin<VT+VDS
First MOSFET 11: Saturation region, ID1=K $(Vin-VT)^2$
Second MOSFET 12: Saturation region
ID2=K $(2VT+VDS-Vin-VT)^2$
IO=2K·VDS·Vin−K (VDS+2VT) VDS Region C: VT+VDS≦Vin
First MOSFET 11: Non-saturation region
ID1=2K·VDS·Vin−K (VDS+2VT) VDS
Second MOSFET 12: Cutoff region, ID2=0
IO=2K·VDS·Vin−K (VDS+2VT) VDS As described above, a voltage-to-current conversion circuit, having a linear input signal range from the grounding potential to the power source voltage, can be realized with a circuit that uses the two n channel MOSFETs shown in FIG. 4A.

In the configuration shown FIG. 4A, the sources of the first MOSFET 11 and the second MOSFET 12 are grounded, respectively, and the voltage VDS is applied to each drain so that the first MOSFET 11 and the second MOSFET 12 are made to operate so as to produce current signals complementary to each other. There are, however, various modifications for the method to make both the first MOSFET 11 and the second MOSFET 12 produce complementary current signals. FIG. 5A and FIG. 5B show examples of those modifications.

In the configuration shown in FIG. 5A, the source of the first MOSFET 11 is grounded and the voltage VDS is applied to the drain, which are the same as the case of the configuration shown in FIG. 4, but the input voltage Vin is applied to the source of the second MOSFET 12, the constant voltage VG, which is equal to VDS+2VT, is applied to the gate, and the voltage VDS+Vin generated in a drain voltage generation circuit 15 is applied to the drain. Therefore, the drain-source voltage becomes VDS. In this case, the operations of the first MOSFET 11 and the second MOSFET 12 can be divided into the following three regions according to the input voltage Vin.

Region A: Vin≦VT
First MOSFET 11: Cutoff region, ID1=0
Second MOSFET 12: Non-saturation region
ID2=−2K (Vin−VG/2) (VG−2VT)
IO=2K·Vin (VG−2VT)−K·VG (VG−2VT)

Region B: VT<Vin<VG−VT
First MOSFET 11: Saturation region, ID1=K $(Vin-VT)^2$
Second MOSFET 12: Saturation region
ID2=K $(VG-Vin-VT)^2$
IO=2K·Vin (VG−2VT)−K·VG (VG−2VT)

Region C: VG−VT≦Vin
First MOSFET 11: Non-saturation region
ID1=2K (Vin−VG) (VG−2VT)
Second MOSFET 12: Cutoff region, ID2=0
IO=2K·Vin (VG−2VT)−K·VG (VG−2VT)

As described above, a voltage-to-current conversion circuit, having a linear input signal range from the grounding potential to the power source voltage, can be realized with a circuit that uses the two n channel MOSFETs shown in FIG. 5A.

In the configuration shown in FIG. 5A, the constant voltage VG to be applied to the gate of the second MOSFET 12 is generated in the constant voltage source, but another configuration is possible in which VDS+2 VT is generated from the voltage VDS in a gate bias generation circuit 16 and applied to the gate of the second MOSFET 12 as shown in FIG. 5B.

Although the cases where n channel MOSFETs are used have been described above as examples, it is also possible to use p channel MOSFETs in the configuration.

According to the present invention, as described above, attention has been focused on the fact that the difference in the currents that flow in two MOSFETs is linear with the input voltage within the power source voltage range, if the two MOSFETs of the same polarity are so set that the currents that flow in each MOSFET vary symmetrically with respect to a fixed input voltage value, that is, that they operate complementarily. Therefore, operation conditions can be set variously as long as two MOSFETs operate complementarily.

BRIEF DESCRIPTION OF THE DRAWINGS

The features and advantages of the invention will be more clearly understood from the following description taken in conjunction with the accompanying drawings, in which.

DESCRIPTION OF THE PREFERRED EMBODIMENTS

Figure 4A:
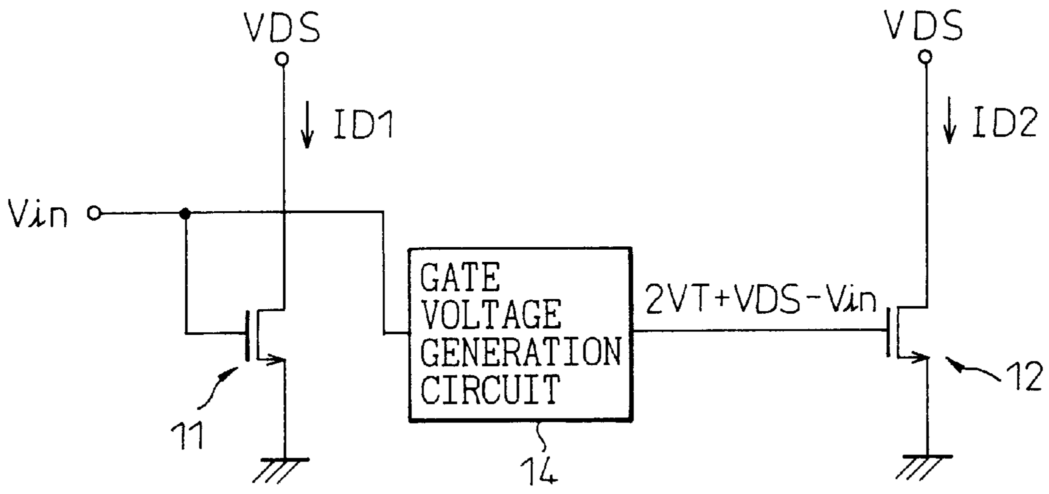
FIG. 4A and FIG. 4B are diagrams that show the basic circuit configuration and the operation principles, respectively, of the first aspect that realizes the voltage-to-current conversion circuit of the present invention.
Figure 6:
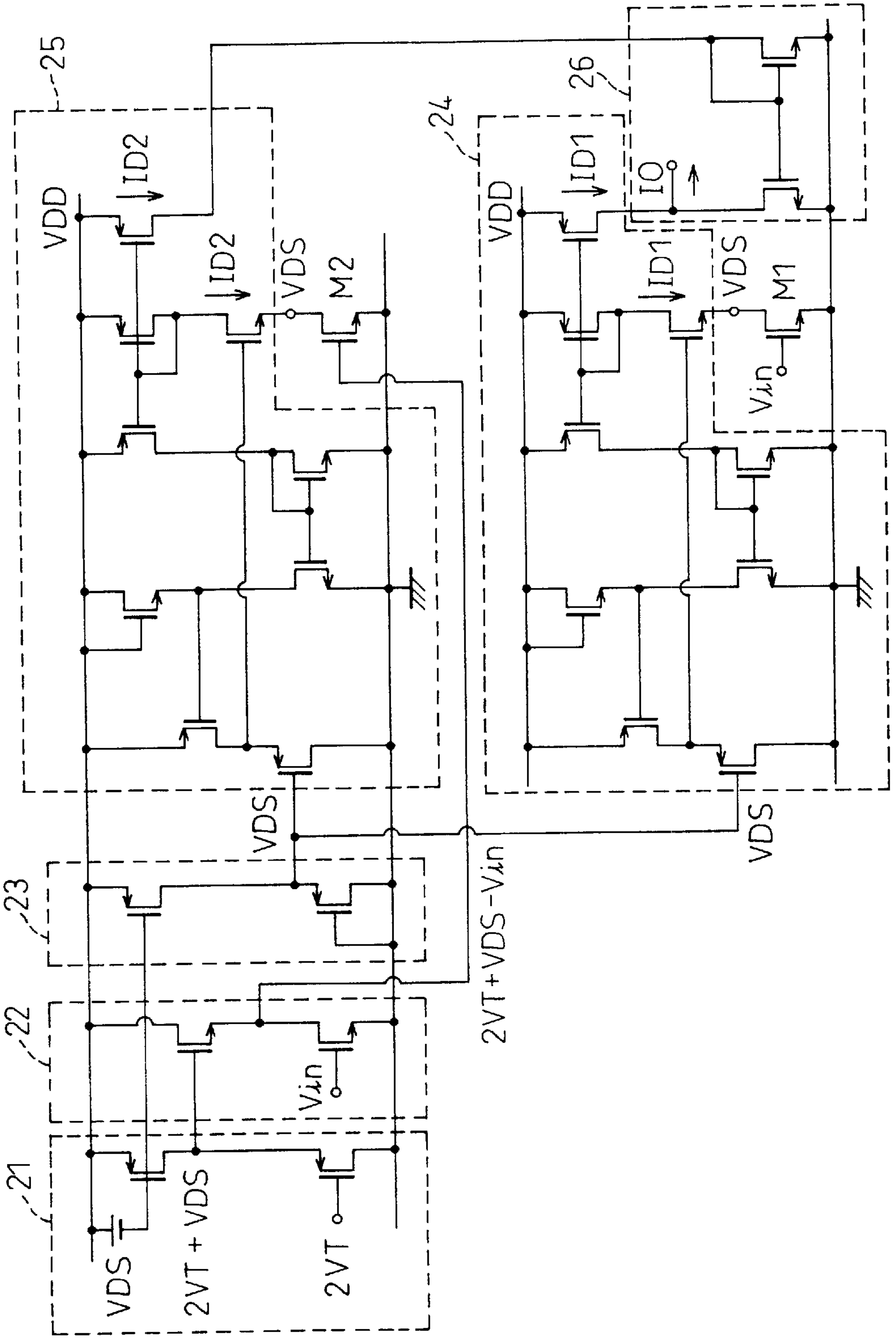
FIG. 6 is a diagram that shows the circuit configuration of the voltage-to-current conversion circuit in the first embodiment, which is the voltage-to-current conversion circuit of the first aspect of the present invention realized using n channel MOSFETs.

FIG. 6 is a diagram that shows the circuit configuration of the voltage-to-current conversion circuit in the first embodiment of the present invention and this embodiment is an example in which the basic configuration shown in FIG. 4A is realized using n channel MOSFETs. As shown in FIG. 6, the voltage-to-current conversion circuit in the first embodiment comprises an n channel MOSFET (field effect transistor) M1 that corresponds to the first MOSFET and an n channel MOSFET (field effect transistor) M2 that corresponds to the second MOSFET shown in FIG. 4, respectively, a circuit 21 that generates the voltage 2 VT+VDS from the voltage VDS and the voltage 2 VT, a circuit 22 that generates the voltage 2 VT+VDS−Vin from the voltage 2 VT+VDS and the input voltage Vin, a circuit 23 that generates the voltage VDS from the voltage VDS, which is applied to the transistor, a circuit 24 that fixes the drain potential of M1 to VDS and takes out its current ID1, a circuit 25 that fixes the drain potential of M2 to VDS and takes out its current ID2, and a difference operation circuit 26 that performs the operation of the difference current IO between ID1 and ID. Therefore, the part composed of the circuit 21 and the circuit 22 corresponds to the gate voltage generation circuit 14 in FIG. 4A.

Figure 7:
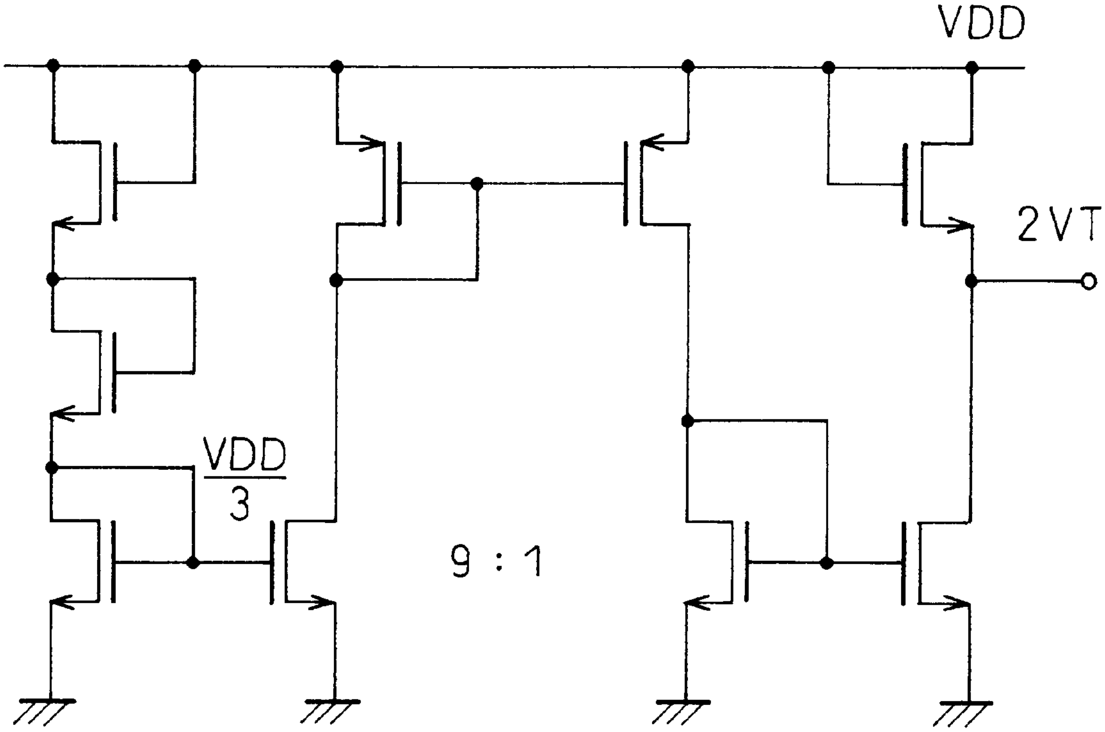
FIG. 7 is a diagram that shows an example of the circuit configuration of a 2 VT generation circuit to be used in the embodiments of the present invention.

The voltage 2 VT to be supplied to the circuit 21 is twice as great as that of the threshold voltage that the n channel MOSFET possesses, and for example, the circuit disclosed in Wada, Takagi, Fujii, "Realization of MOSFET Characteristics without Cutoff Region", ECT-99-113, pp. 19–24, October 1999 can be used. One example of the circuit is shown in FIG. 7.

Figure 4B:
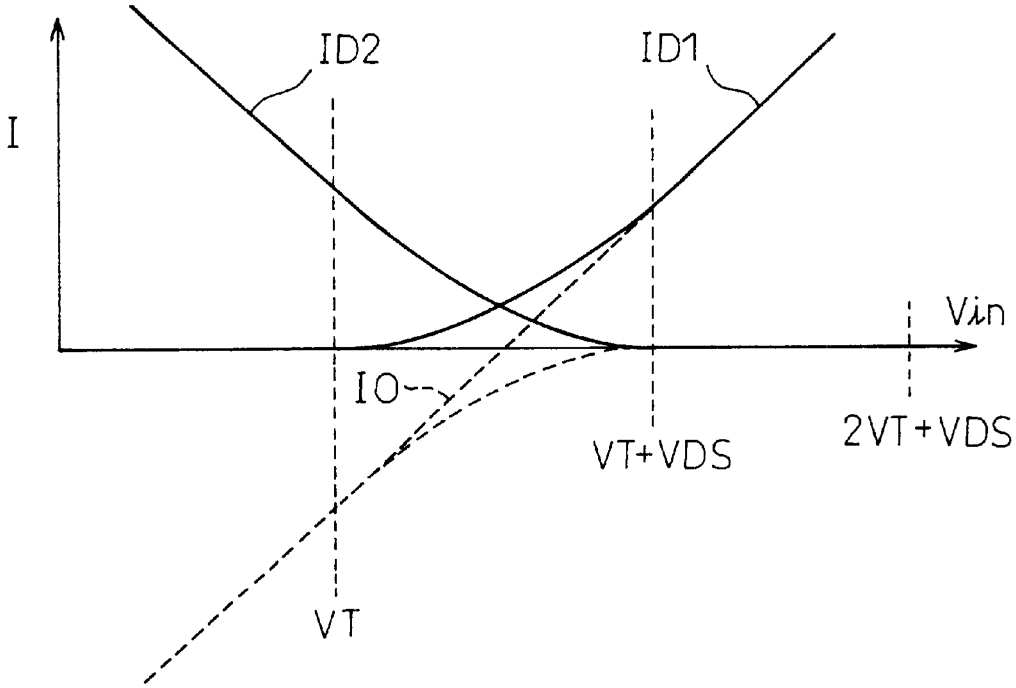

The circuit 21 and the circuit 22 generate the voltage 2 VT+VDS−Vin to be applied to the gate of M2. As shown in FIG. 4B, the range of the input voltage Vin in which the drain current flows into M2 is as follows.

$$0 \leqq Vin < VDS + VT \quad (1)$$

Since the gate potential VG2 of M2 is 2 VT+VDS−Vin, VG2 varies in the following range.

$$VT < VG2 < VDS + 2VT \quad (2)$$

Therefore, it is required that the input signal range of the circuit 21 and the circuit 22 should be larger than that shown in the expression (1). The circuit 21 is a level shift circuit composed of two p channel MOSFETs and generates 2 VT+VDS by shifting 2 VT by VDS in the positive direction. The circuit 22 is also a level shift circuit composed of two n channel MOSFETs and generates 2 VT+VDS−Vin by shifting 2 VT+VDS by Vin in the negative direction. It is assumed that all the constituent MOSFETs of the circuit 21 and the circuit 22 operate in the saturation region and a region called a weak reversal region. Moreover, the fact is utilized that since the drain current of the MOSFET depends only on the voltage between the gate and the source in the saturation region and the weakly reversal region, the voltages between the gate and the source of the two MOSFETs in which the same drain current flows are equal to each other.

In order for the p channel MOSFET in the circuit 21, to the gate of which VDS is applied, always to be able to operate in the saturation region and the weak reversal region, the power source voltage VDD is required to satisfy the following expression, $$2VT - |VTP| + 2VDS < VDD \quad (3)$$

where VTP is the threshold voltage of the p channel MOSFET. In addition, in order for the n channel MOSFET, to the gate of which Vin is applied, to be able to operate in the saturation region and the weak reversal region, the following condition has to be satisfied.

$$VDS \leqq VT \quad (4)$$

The circuit 26 is a current mirror circuit and generates the difference current IO between the current ID1 that flows through M1 and the current ID2 that flows through M2. The difference current IO is shown by the following expression.

$$IO = ID1 - ID2 = 2K \cdot VDS \cdot Vin - K(VDS + 2VT)VDS \quad (5)$$

Figure 1:
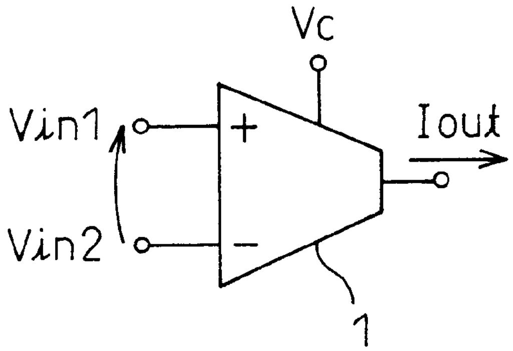
FIG. 1 is a diagram that shows the general symbols used in a circuit diagram of an OTA.
Figure 2:
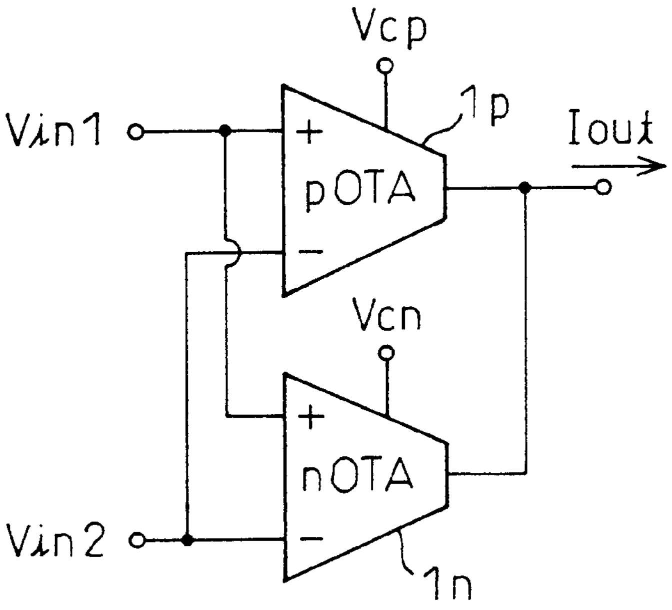
FIG. 2 is a diagram that shows a conventional example of an OTA with Rail-to-Rail, which is the combination of an OTA circuit of a p channel MOSFET and that of an n channel MOSFET.
Figure 3:
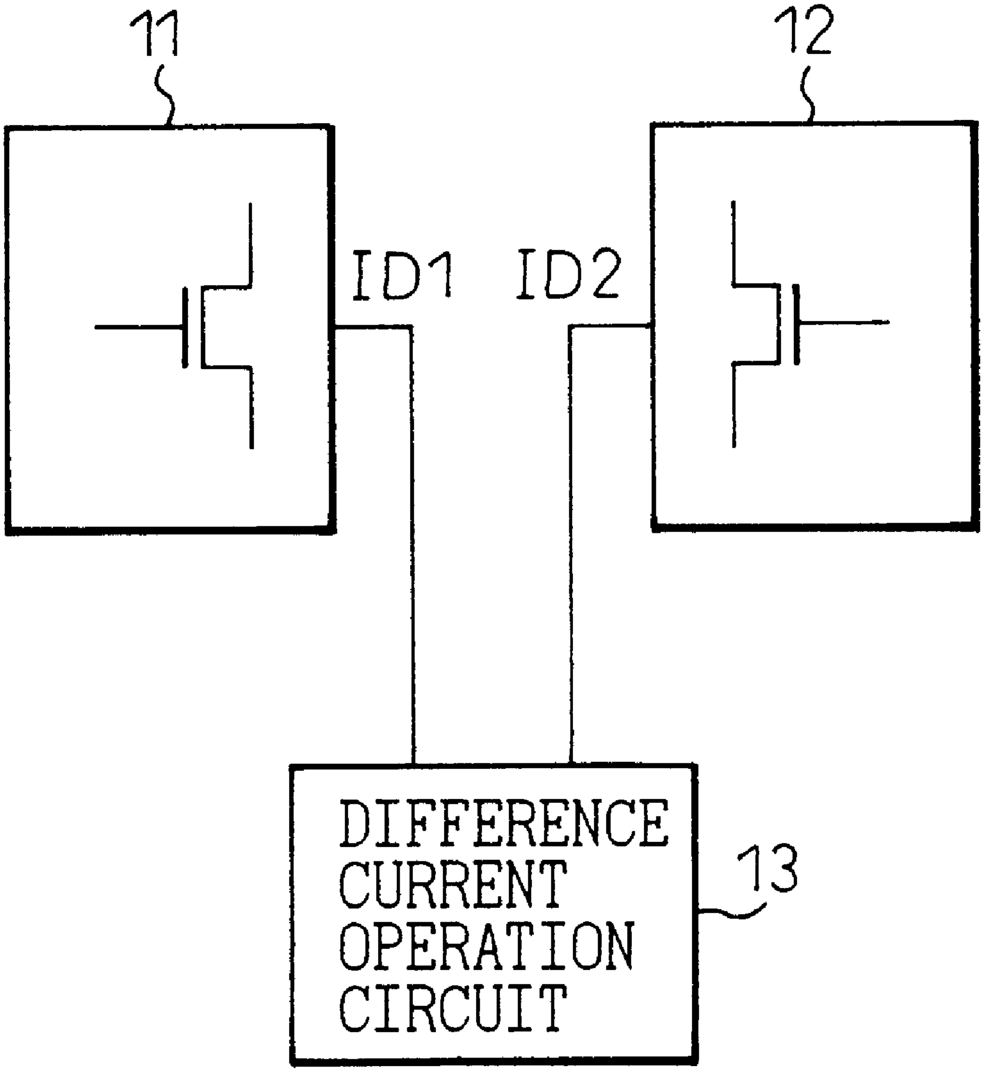
FIG. 3 is a diagram that shows the basic configuration of the voltage-to-current conversion circuit of the present invention.

Next, the OTA that uses the voltage-to-current conversion circuit in the first embodiment is described. The OTA is a circuit that puts out the current Iout corresponding to the difference between the two input voltages Vin1 and Vin2, as shown in FIG. 1, and the relationship is shown as follows, where the conversion coefficient is assumed to be gm, $$I\ out = gm(Vin1 - Vin2) = gm \cdot Vin1 - gm \cdot Vin2 \quad (6)$$

Therefore, the OTA can be realized by using the two voltage-to-current conversion circuits in the first embodiment.

Figure 8:
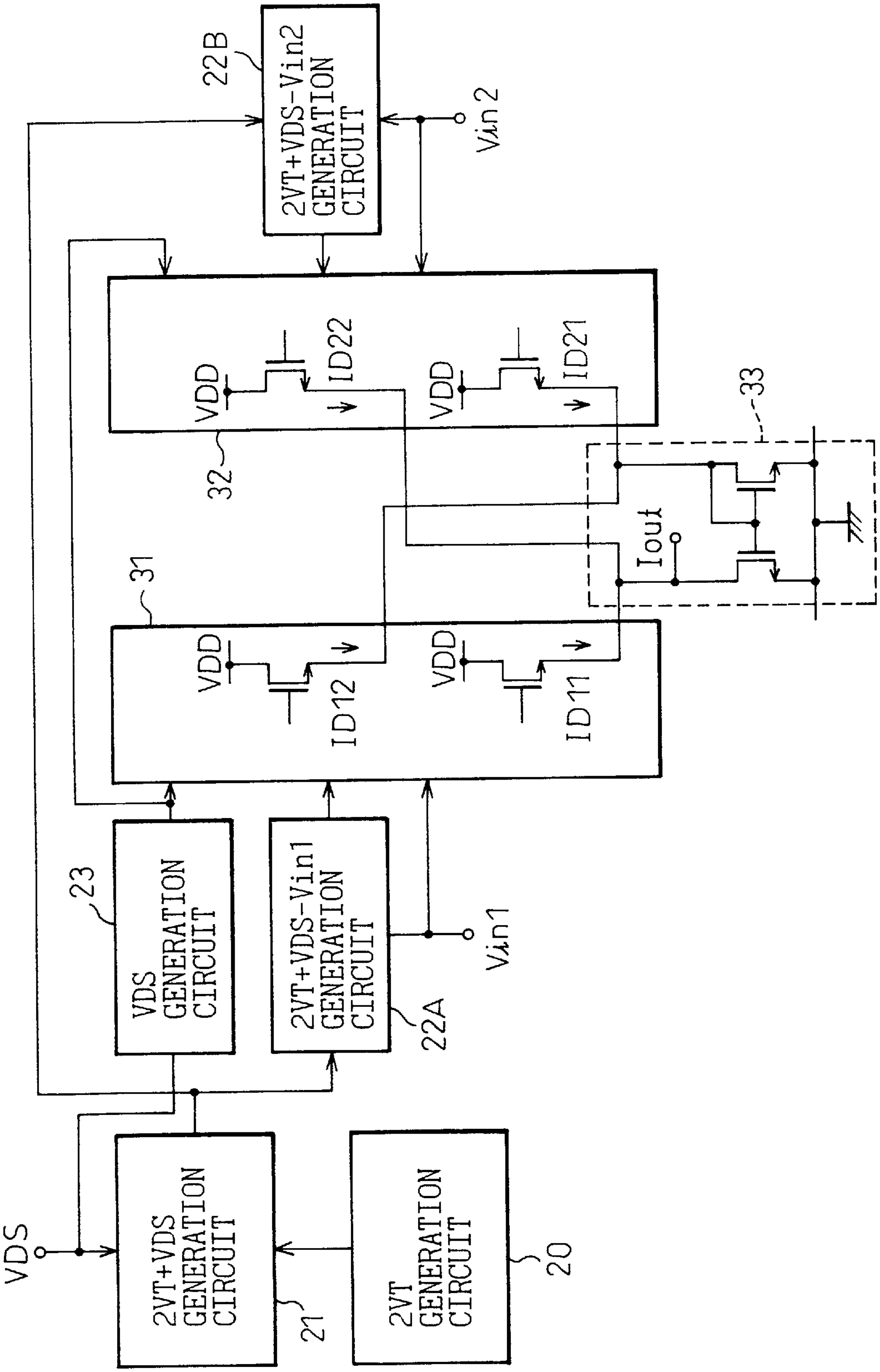
FIG. 8 is a diagram that shows the rough configuration of an OTA that uses the two voltage-to-current conversion circuits in the first embodiment.

FIG. 8 is a diagram that shows a configuration of an OTA that uses the two voltage-to-current conversion circuits in the first embodiment. The input signal range of the voltage-to-current conversion circuit in the first embodiment is that of the power source voltage, therefore, this OTA also has the input signal range of the Rail-to-Rail. As shown schematically, this OTA comprises a first voltage-to-current conversion circuit 31, a second voltage-to-current conversion circuit 32, a 2 VT generation circuit 20 that generates 2 VT as shown in FIG. 7, a 2 VT+VDS generation circuit 21 shown in FIG. 6, a 2 VT+VDS−Vin1 generation circuit 22A that generates 2 VT+VDS−Vin1 to be supplied to the first voltage-to-current conversion circuit 31, a 2 VT+VDS−Vin1 generation circuit 22B that generates 2 VT+VDS−Vin1 to be supplied to the second voltage-to-current conversion circuit 32, and a difference output operation circuit 33 that performs the operation to calculate the difference current Iout between the output currents 101 and 102 of the first and the second voltage-to-current conversion circuits 31 and 32.

If the currents that flow through the first MOSFET and the second MOSFET in the first voltage-to-current conversion circuit 31 are denoted as ID11 and ID12, respectively, and the currents that flow through the first MOSFET and the second MOSFET in the second voltage-to-current conversion circuit 32 are denoted as ID21 and ID22, respectively, the above-mentioned expression (6) is rewritten as follows.

$$I\ out = IO1 - IO2 = (ID11 - ID12) - (ID21 - ID22) = (ID11 + ID22) - (ID12 + ID21)$$

Then, in the difference output operation circuit 33, the difference is calculated after the operations of addition of ID11 and ID22 and that of ID12 and ID21 are performed.

Figure 9:
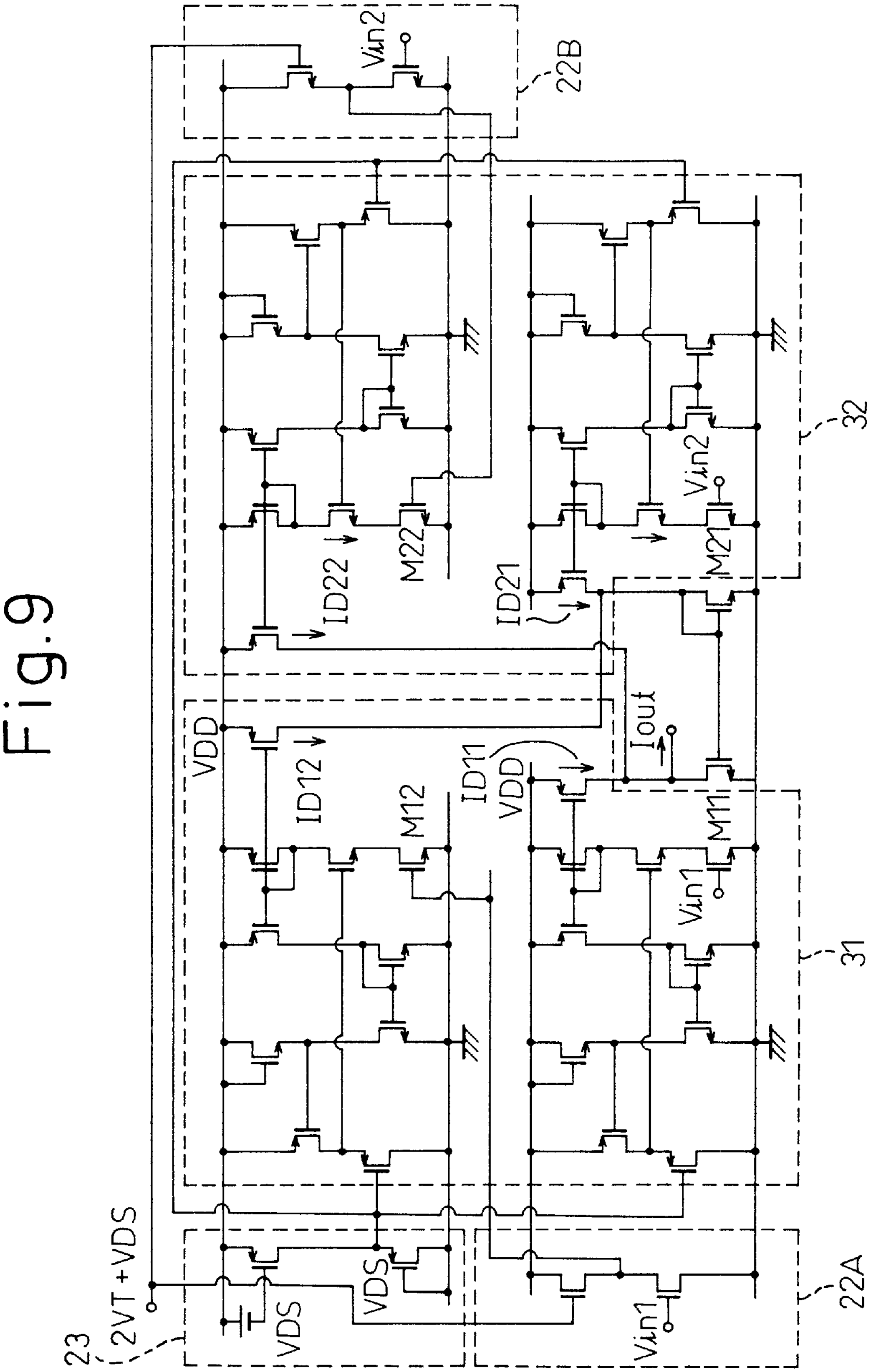
FIG. 9 is a diagram that shows the circuit configuration of the OTA shown in FIG. 8.

FIG. 9 is a diagram that shows the circuit configuration of the OTA. In the figure, however, the 2 VT generation circuit 20 and the 2 VT+VDS generation circuit are omitted.

In the first embodiment, the n channel MOSFETs are used as M1 and M2, but it is also possible to use p channel MOSFETs. The second embodiment is an example of this case.

Figure 10:
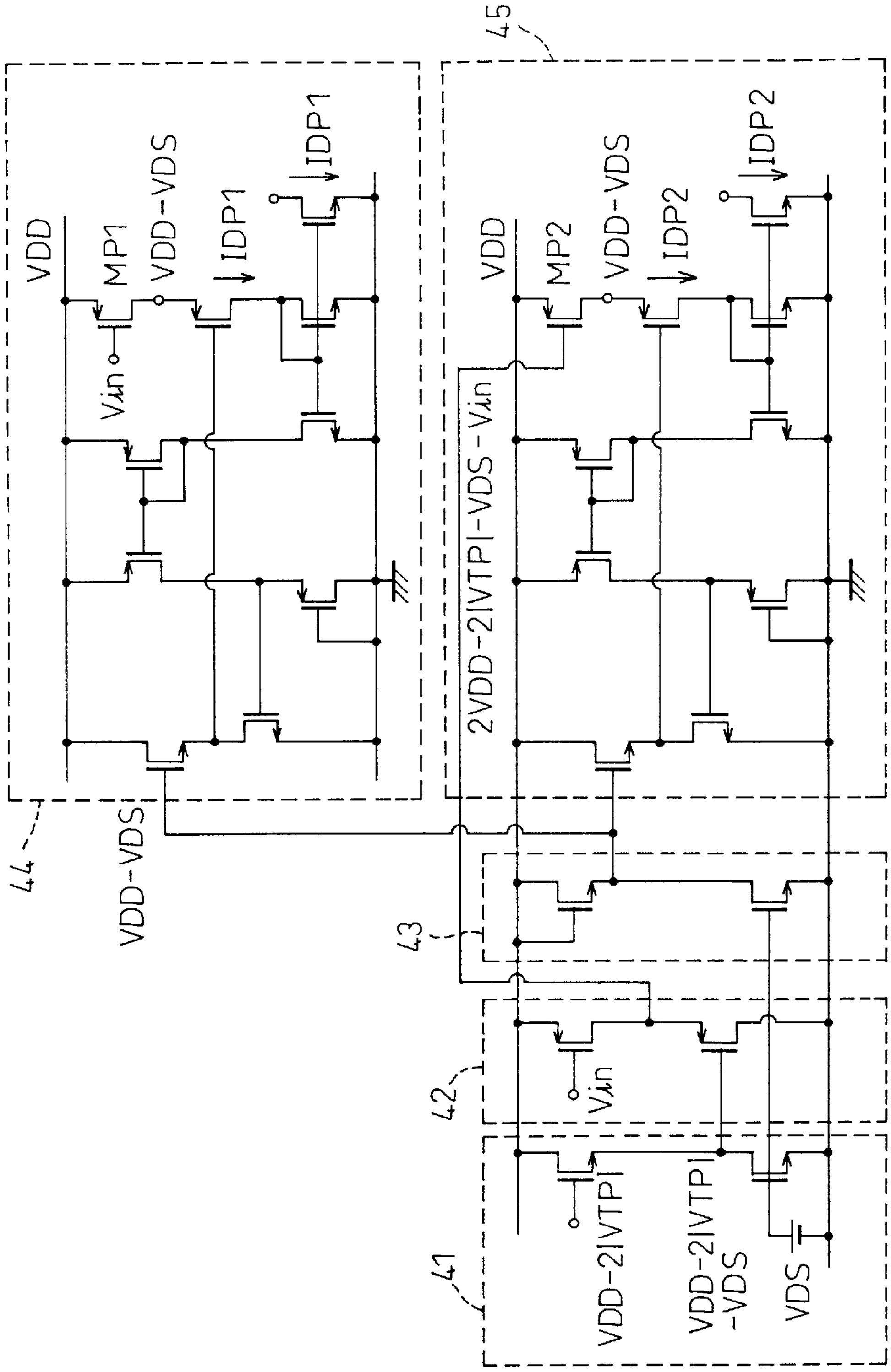
FIG. 10 is a diagram that shows the circuit configuration of the voltage-to-current conversion circuit in the second embodiment, which is the voltage-to-current conversion circuit of the first aspect of the present invention realized using p channel MOSFETs.

FIG. 10 is a diagram that shows the circuit configuration of the voltage-to-current conversion circuit in the second embodiment. AS shown in FIG. 10, the voltage-to-current conversion circuit in the second embodiment comprises a circuit 41 that generates VDD−2|VTP|−VDS, a circuit 42 that generates 2 VDD−2|VTP|−VDS−Vin, a circuit 43 that generates VDS to be applied to the gate, a circuit 44 that fixes the drain current of the first MOSFET (MP1) of p channel type to VDD−VDS and takes out its drain current, and a circuit 45 that fixes the drain current of the second MOSFET (MP2) of p channel type to VDD−VDS and takes out its drain current.

Figure 5A:
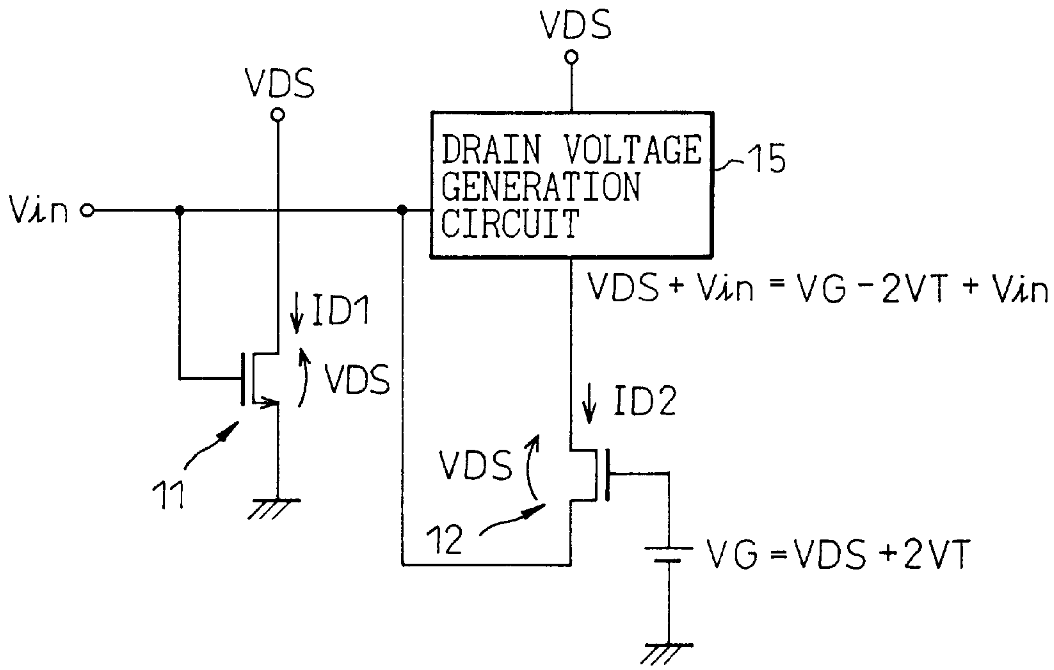
FIG. 5A and FIG. 5B are diagrams that show the basic circuit configuration and an example of the modification, respectively, of the second aspect that realizes the voltage-to-current conversion circuit of the present invention.
Figure 5B:
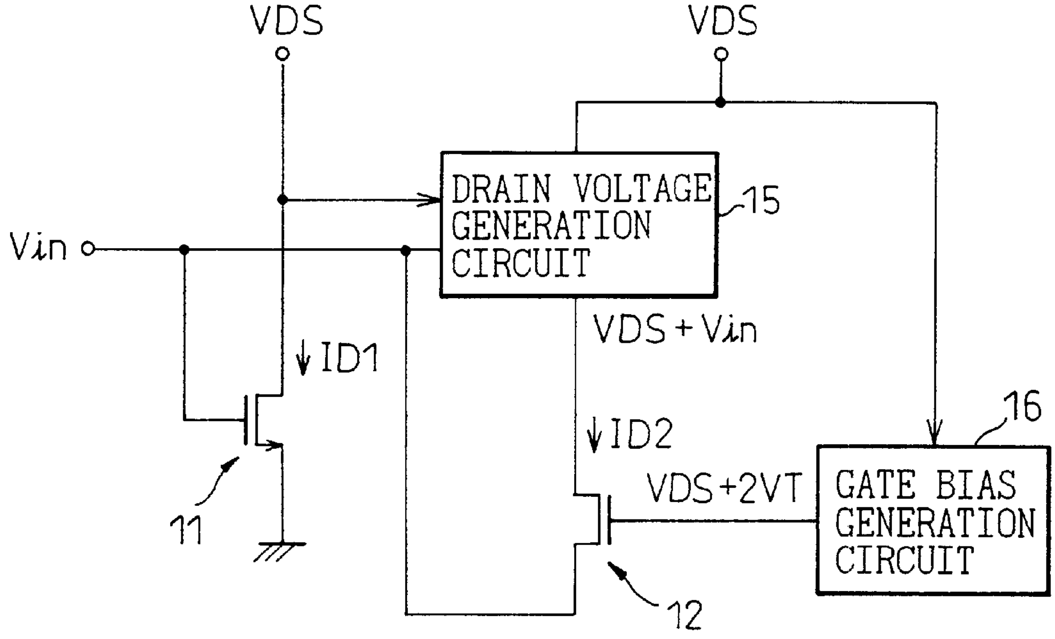

Next, the basic configuration shown in FIG. 5A is described with the third embodiment that is realized using n channel MOSFETs.

Figure 11:
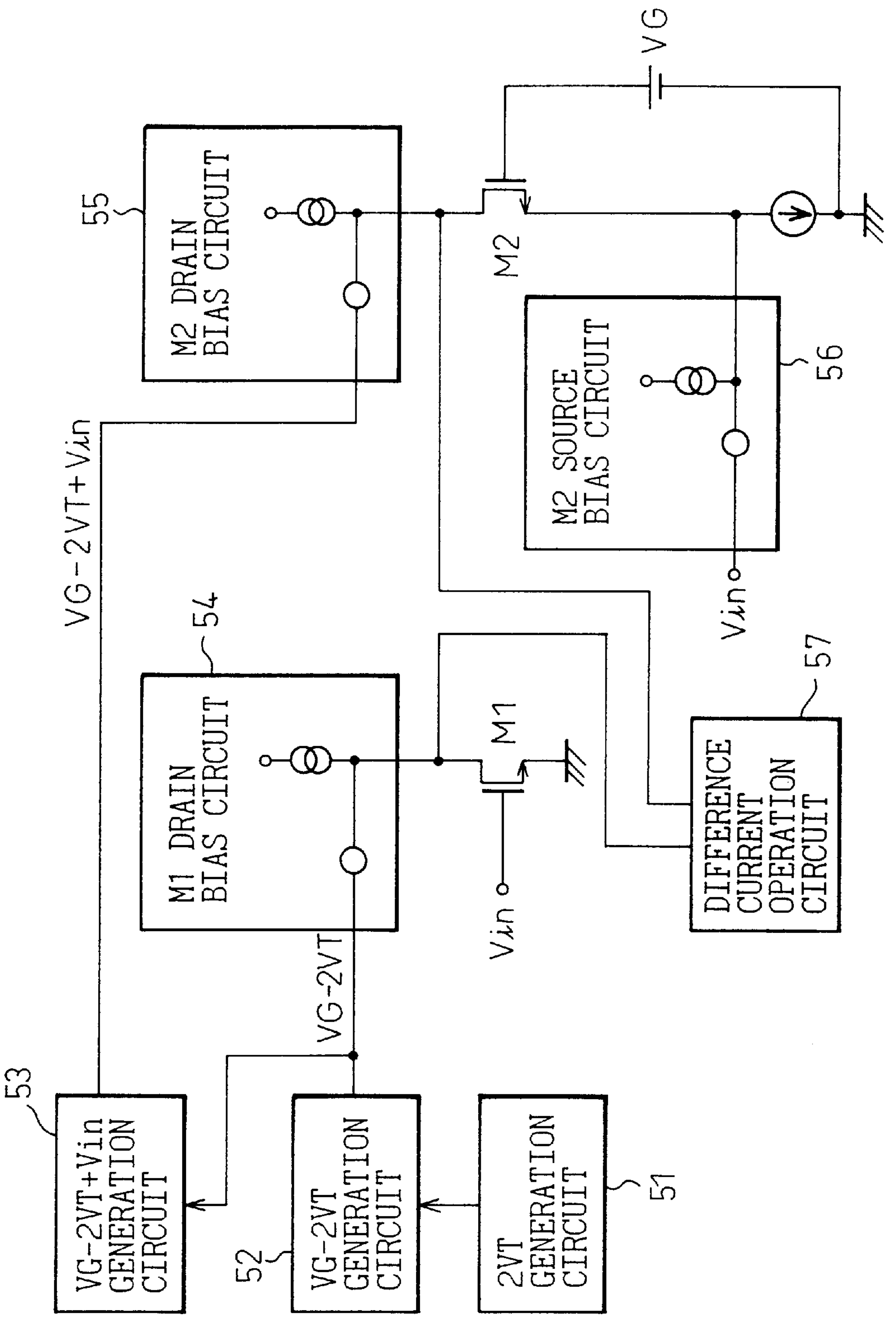
FIG. 11 is a diagram that shows the rough configuration of the voltage-to-current conversion circuit in the third embodiment, which is the voltage-to-current conversion circuit of the second aspect of the present invention realized using n channel MOSFETs.

FIG. 11 is a diagram that shows the rough configuration of the voltage-to-current conversion circuit in the third embodiment. As shown schematically, the voltage-to-current conversion circuit in the third embodiment comprises M1 that corresponds to the first MOSFET and M2 that corresponds to the second MOSFET in FIG. 5A, respectively, a power source VG that supplies the gate voltage VG to be applied to the gate of M2, a 2 VT generation circuit 51, a circuit 52 that generates the voltage VG−2 VT from the fixed voltage VG and 2 VT, a circuit 53 that generates the voltage VG−2 VT+Vin from the VG−2 VT and the input voltage Vin, an M1 drain bias circuit 54 that fixes the drain potential of M1 to VDS and takes out its current ID1, an M2 drain bias circuit 55 that fixes the drain potential of M2 to VDS and takes out its current ID2, an M2 source bias circuit 56 that applies the input voltage Vin to the source of M2, and a difference operation circuit 57 that performs the operation to calculate the difference current IO between ID1 and ID2. Therefore, the part composed of the circuits 51 to 53 corresponds to the drain voltage generation circuit 15 in FIG. 5A.

Figure 12:
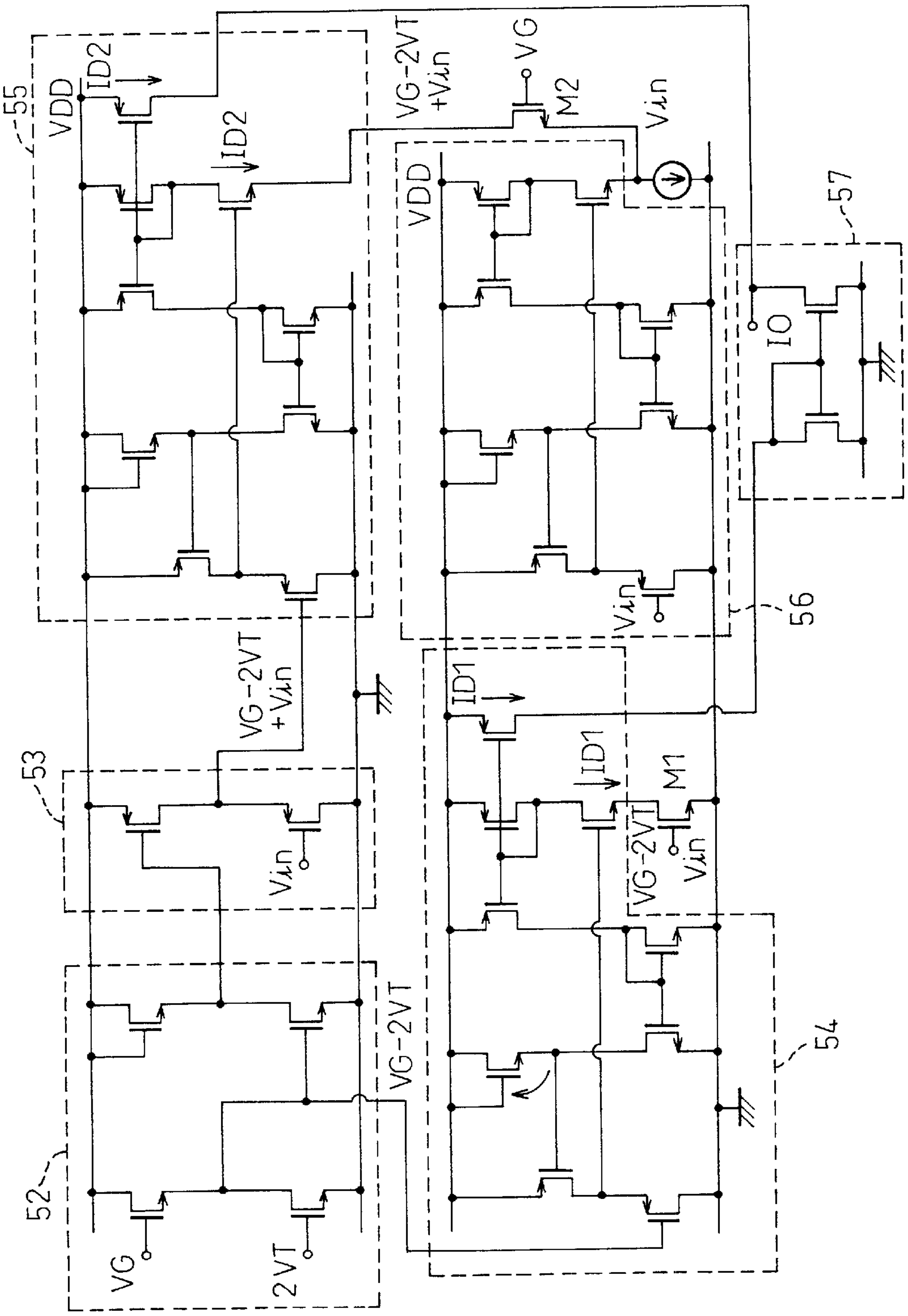
FIG. 12 is a diagram that shows the circuit configuration of the voltage-to-current conversion circuit in the third embodiment.

FIG. 12 is a diagram that shows the circuit configuration of the voltage-to-current conversion circuit in the third embodiment. The power source VG and the 2 VT generation circuit 51 are omitted. As shown schematically, the configuration of each part of the circuit is similar to that of the first embodiment, and the operations are also similar. As the operation principles of the entire voltage-to-current conversion circuit are the same as those described with reference to FIG. 5A, a more detailed description is not given here.

Figure 13:
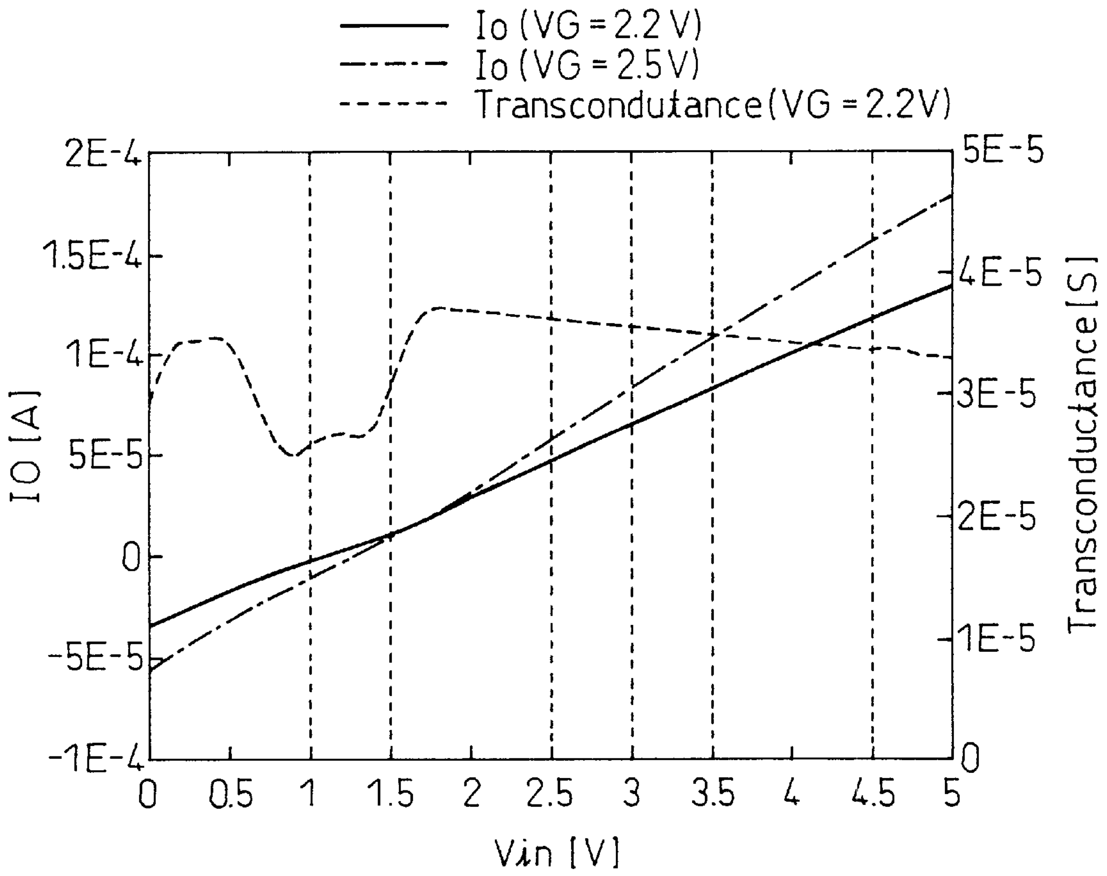
FIG. 13 is a diagram that shows the input voltage-to-output current characteristic of the voltage-to-current conversion circuit in the third embodiment.

FIG. 13 shows the simulation results of the relationship between the input voltage Vin and the output current IO of the voltage-to-current conversion circuit in the third embodiment. As shown schematically, it is known that an almost linear output current IO can be obtained for the input voltage Vin within the power source voltage range.

Figure 14:
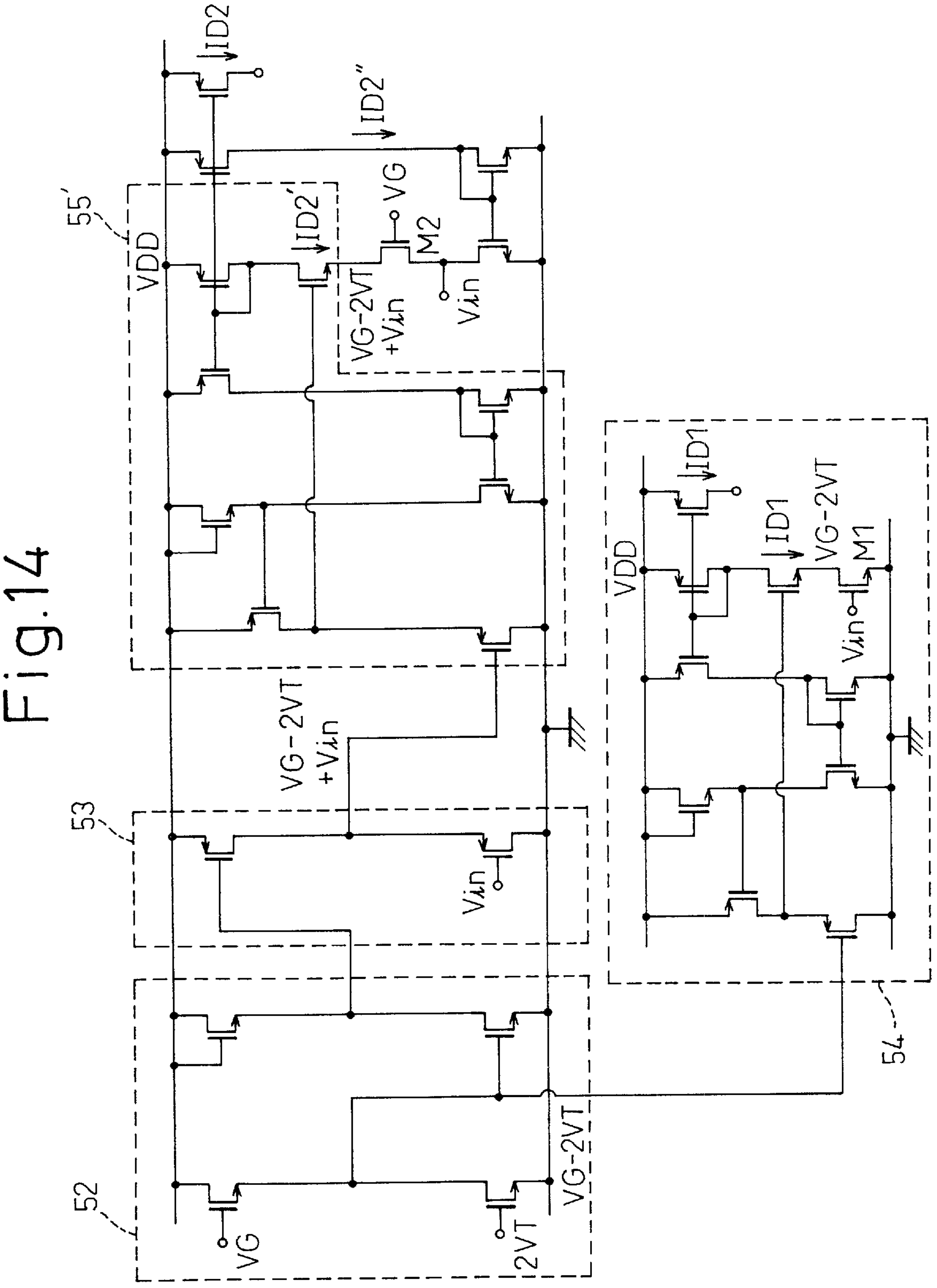
FIG. 14 is a diagram that shows the circuit configuration of the voltage-to-current conversion circuit of a modification example of the third embodiment.

In the voltage-to-current conversion circuit in the third embodiment, the input voltage Vin is applied to the source of M2 via the M2 source bias circuit 56, but it is possible to apply the input voltage Vin directly to the source. FIG. 14 is a diagram that shows the circuit configuration of one example of the modifications. In this modification example, the input voltage Vin is applied directly to the source terminal of M2, and simultaneously the current ID2 is generated after the ID2' taken out from the drain side is turned back by the current mirror circuit and taken out to the grounding side, in order to prevent the current from flowing to the input terminal of the input voltage Vin. Other parts are the same as those of the third embodiment.

Figure 15:
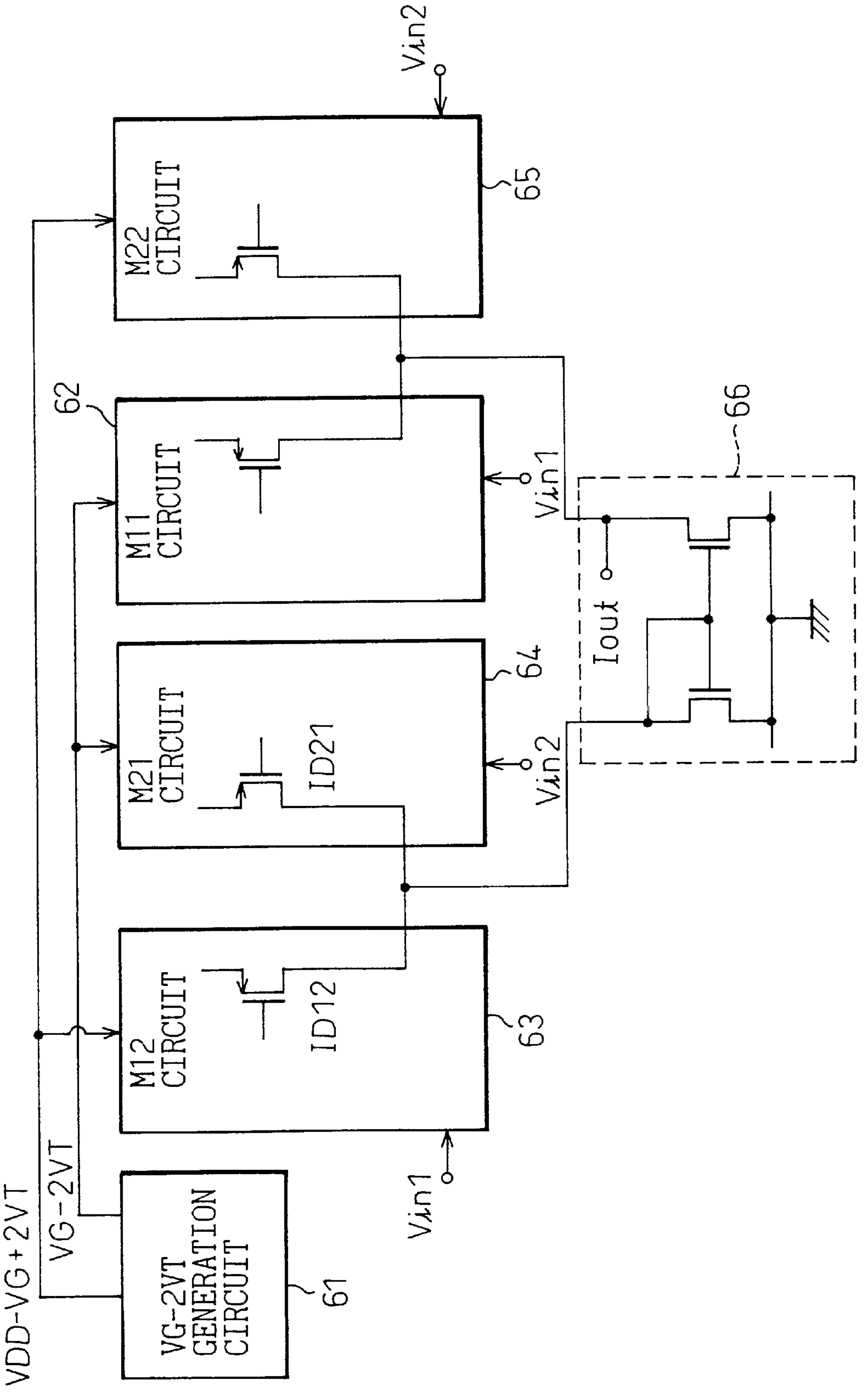
FIG. 15 is a diagram that shows the rough configuration of an OTA that uses the two voltage-to-current conversion circuits in the third embodiment.

Since the voltage-to-current conversion circuit in the third embodiment also shows the linear output characteristic for the input signal within the power source voltage range, the OTA circuit with Rail-to-Rail can be realized by using two of the circuits. FIG. 15 is a diagram that shows a configuration of an OTA circuit that uses two of the voltage-to-current conversion circuits in the third embodiment. As shown schematically, the OTA circuit comprises a circuit 61 that generates VG−2 VT and VDD−VG+2 VT, an M11 circuit 62, an M12 circuit 63, an M21 circuit 64, an M22 circuit 65, and a difference output operation circuit 66. The circuit 61 corresponds to the circuit 52 in FIG. 12, the M11 circuit 62 and the M21 circuit 64 correspond to M1 and the circuit 54 in FIG. 12, respectively, and the M12 circuit 63 and the M22 circuit 65 correspond to the part composed of M2, the circuit 55, and the circuit 56 in FIG. 12 or to that composed of M2, the circuit 55', and the current mirror circuit in FIG. 14. The circuit 53 in FIG. 12 is included in the M12 circuit 63 and the M22 circuit 65. In this OTA also, the difference output operation circuit 66 performs the operation to calculate the difference after the operations to calculate the addition of ID11 and ID22 and that of ID12 and ID21.

Figure 16:
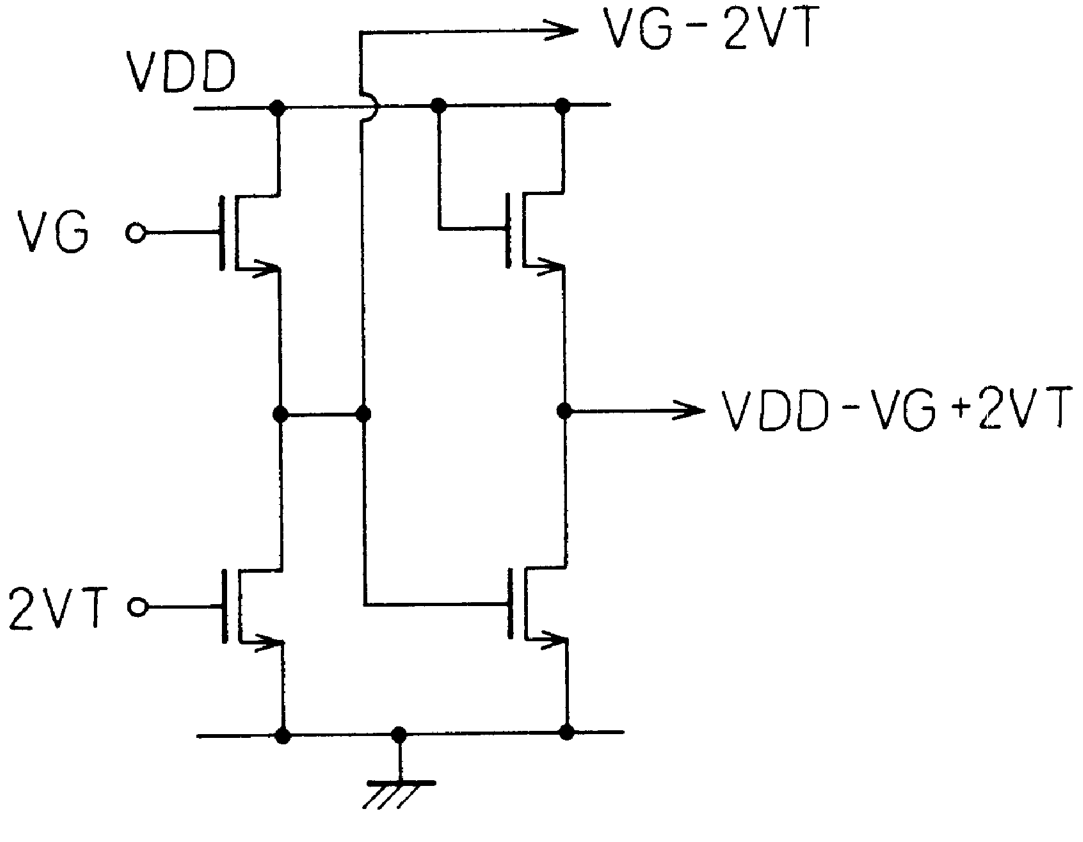
FIG. 16 is a diagram that shows a part of the circuit configuration of the OTA shown in FIG. 15.
Figure 17A:
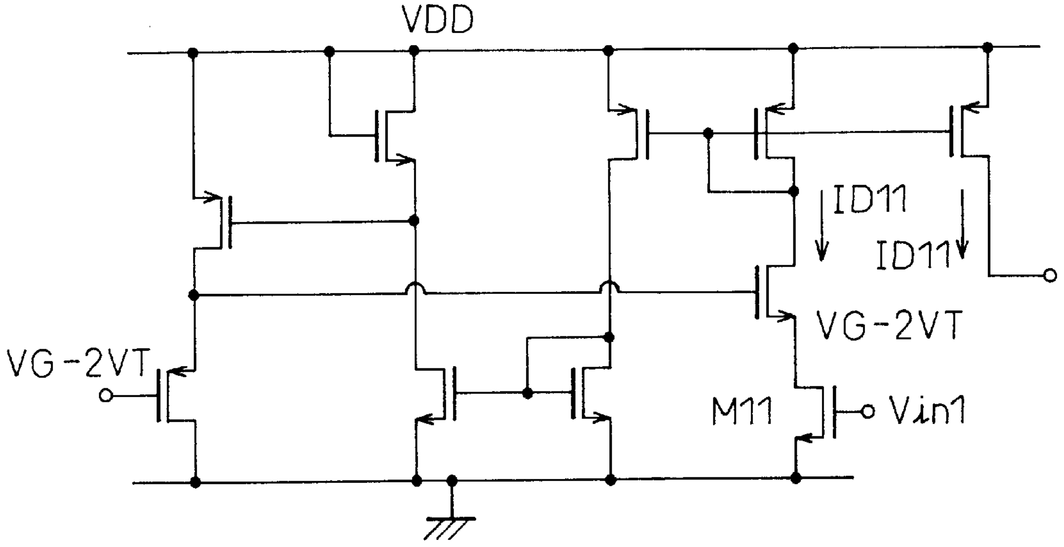
FIG. 17A and FIG. 17B are diagrams that show a part of the circuit configuration of the OTA shown in FIG. 15.
Figure 17B:
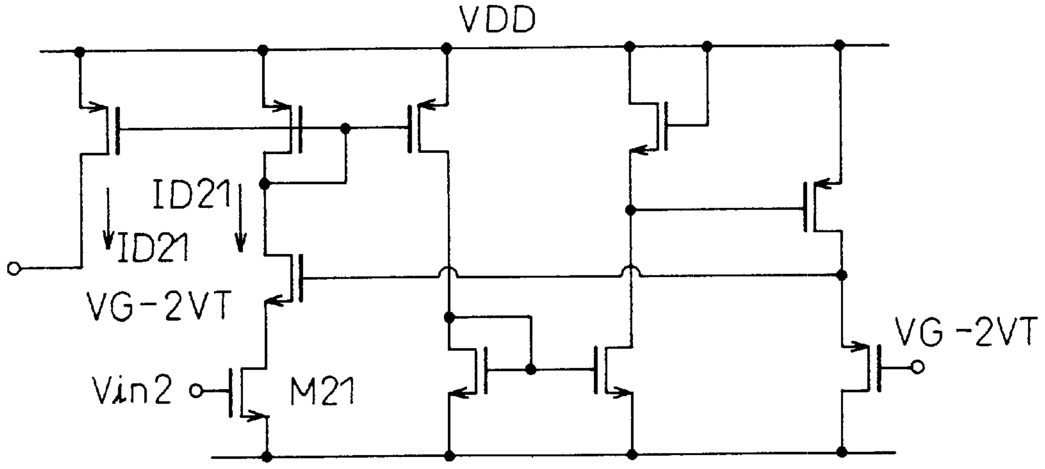
Figure 18:
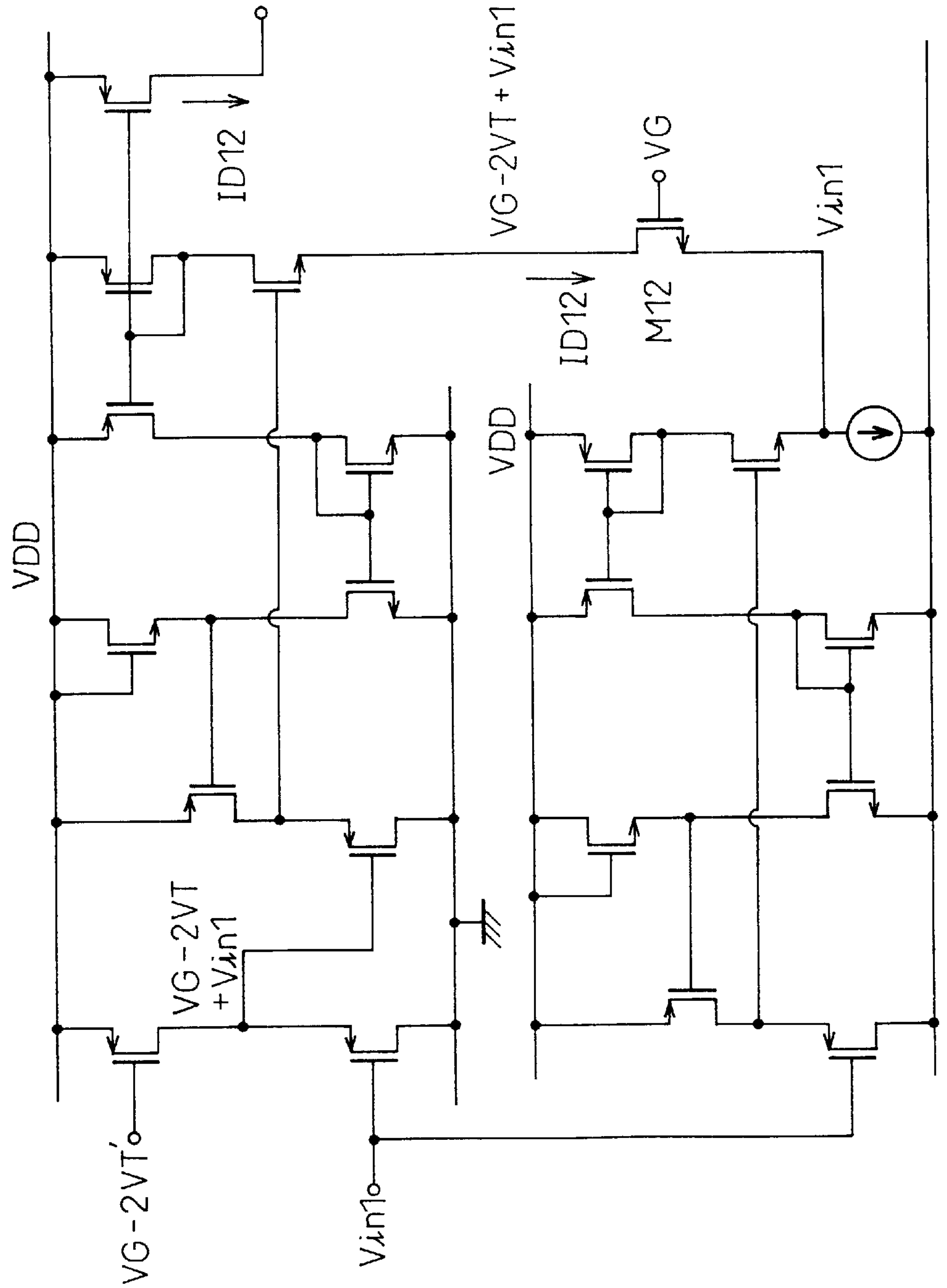
FIG. 18 is a diagram that shows a part of the circuit configuration of the OTA shown in FIG. 15.
Figure 19:
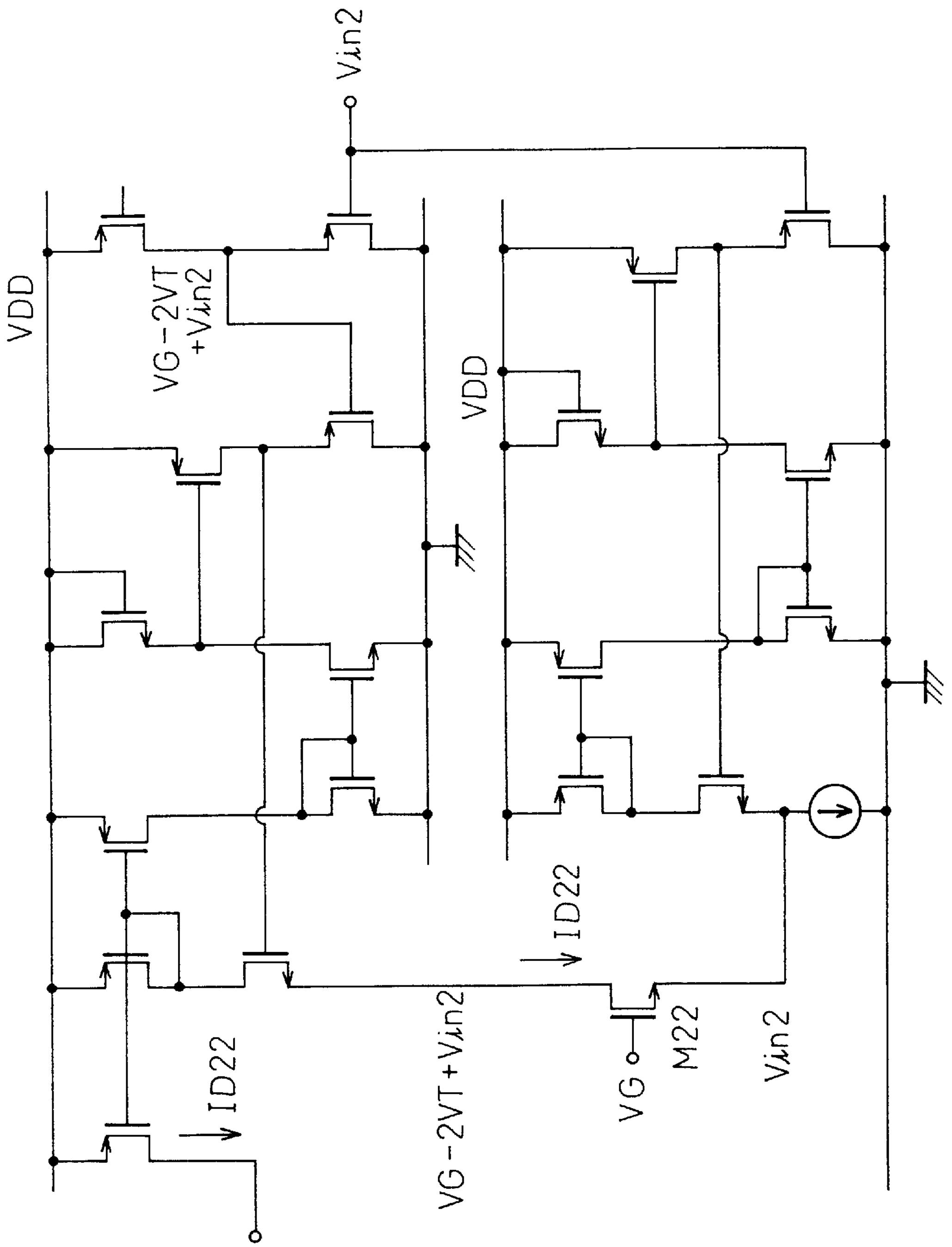
FIG. 19 is a diagram that shows a part of the circuit configuration of the OTA shown in FIG. 15.

The concrete circuit configuration of this OTA is shown in FIG. 16 to FIG. 19. FIG. 16 shows the circuit 61 that generates VG−2 VT and VDD−VG+2 VT, FIG. 17A and FIG. 17B show the M11 circuit 62 and the M21 circuit 64, respectively, FIG. 18 shows the M12 circuit 63, and FIG. 19 shows the M22 circuit 65.

Figure 20:
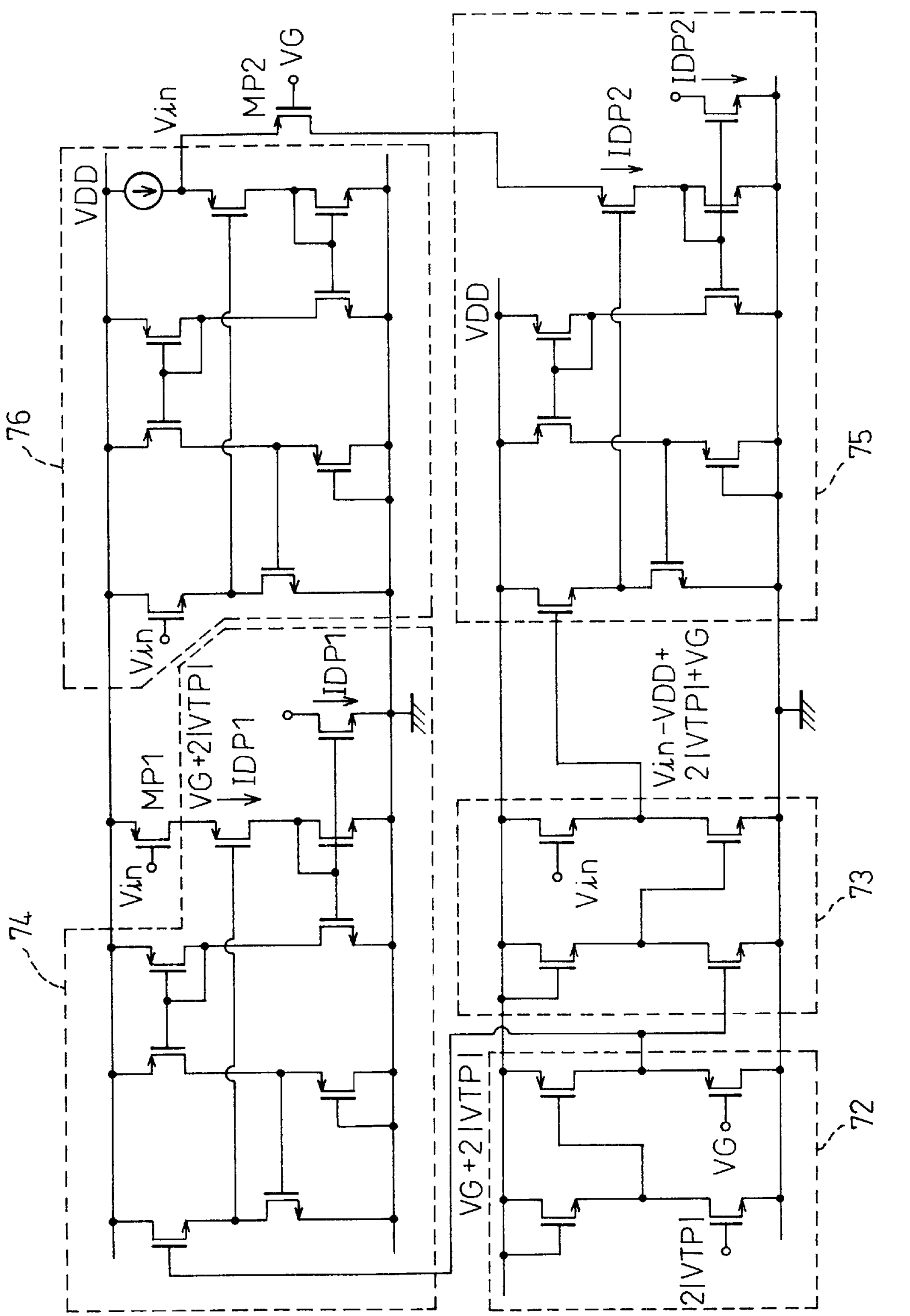
FIG. 20 is a diagram that shows the circuit configuration of the voltage-to-current conversion circuit in the fourth embodiment, which is the voltage-to-current conversion circuit of the second aspect of the present invention realized using p channel MOSFETs.

FIG. 20 is a diagram that shows the circuit configuration of the voltage-to-current conversion circuit in the fourth embodiment. The fourth embodiment is realized by using p channel MOSFETs in the basic configuration shown in FIG. 5A. As shown schematically, the voltage-to-current conversion circuit in the fourth embodiment comprises MP1 that corresponds to the first MOSFET, MP2 that corresponds to the second MOSFET, a circuit 72 that generates a voltage VG+|2 VTP| from the fixed voltage VG and |2 VTP|, a circuit 73 that generates a voltage Vin−VDD+2|VTP|+VG, an M1 drain bias circuit 74 that fixes the drain potential of M1 to VG+2|VTP| and takes out its current IDP1, an M2 drain bias circuit 75 that fixes the drain potential of M2 to Vin−VDD+2|VTP|+VG and takes out its current ID2, and an M2 source bias circuit 76 that applies the input voltage Vin to the source of M2. Circuits such as the difference current operation circuit are omitted.

As described above, according to the present invention, a voltage-to-current conversion circuit with Rail-to-Rail and an OTA can be realized with a simple configuration, in which variations in the transconductance parameters are small because the MOSFETs of the same polarity are used, and in which the transconductance can be set to an almost constant value.

We claim:

1. A voltage-to-current conversion circuit that generates an output current in accordance with an input voltage, comprising a first MOSFET, to which a fixed drain-source voltage is applied all the time and which generates a first current signal for the input voltage;

a second MOSFET, which has the same polarity as that of the first MOSFET, to which the fixed drain-source voltage is applied all the time, and which generates a second current signal that is complementary to the first current signal for the input voltage; and a difference current operation circuit that performs the operation of subtraction between the first current signal and the second current signal.

2. A voltage-to-current conversion circuit, as set forth in claim 1, wherein the input voltage is applied to the gate of the first MOSFET, and said voltage-to-current conversion circuit further comprises a gate voltage generation circuit that generates a voltage obtained by subtracting the input voltage from the sum of the voltage twice the threshold voltage of the second MOSFET, which is applied to the gate of the second MOSFET, and the fixed drain-source voltage.

3. A voltage-to-current conversion circuit, as set forth in claim 1, wherein the input voltage is applied to the gate of the first MOSFET, the input voltage is applied to the source of the second MOSFET; and a fixed gate voltage, which is the sum of the voltage twice the threshold voltage of the second MOSFET and the fixed drain-source voltage, is applied to the gate; and wherein said voltage-to-current conversion circuit further comprises a drain voltage generation circuit that generates a drain voltage, which is the sum of the fixed drain-source voltage and the input voltage, and is applied to the drain of the second MOSFET.

4. A voltage-to-current conversion circuit, as set forth in claim 3, further comprising a gate bias generation circuit that generates the fixed gate voltage to be applied to the gate of the second MOSFET.

5. An OTA that generates an output current in accordance with the difference voltage between a first input voltage and a second input voltage, comprising a first voltage-to-current conversion circuit that generates a first output current in accordance with the first input voltage;

a second voltage-to-current conversion circuit that generates a second output current in accordance with the second input voltage; and a difference output operation circuit that performs the operation to calculate the difference current between the first output current and the second output current, and wherein each of the first voltage-to-current conversion circuit and the second voltage-to-current conversion circuit comprises a first MOSFET, to which a fixed drain-source voltage is applied all the time and which generates a first current signal for the input voltage, a second MOSFET, which has the same polarity as that of the first MOSFET, to which the fixed drain-source voltage is applied all the time, and which generates a second current signal that is complementary to the first current signal for the input voltage, and a difference current operation circuit that performs the operation of subtraction between the first current signal and the second current signal.

6. An OTA, as set forth in claim 5, wherein the input voltage is applied to the gate of the first MOSFET, and said voltage-to-current conversion circuit further comprises a gate voltage generation circuit is comprised that generates a voltage obtained by subtracting the input voltage from the sum of the voltage twice the threshold voltage of the second MOSFET, which is applied to the gate of the second MOSFET, and the fixed drain-source voltage.

7. An OTA, as set forth in claim 5, wherein the input voltage is applied to the gate of the first MOSFET, the input voltage is applied to the source of the second MOSFET; and a fixed gate voltage, which is the sum of the voltage twice the threshold voltage of the second MOSFET and the fixed drain-source voltage, is applied to the gate; and wherein said voltage-to-current conversion circuit further comprises a drain voltage generation circuit is further comprised that generates a drain voltage, which is the sum of the fixed drain-source voltage and the input voltage, and is applied to the drain of the second MOSFET.

8. An OTA, as set forth in claim 7, further comprising a gate bias generation circuit that generates the fixed gate voltage to be applied to the gate of the second MOSFET.

* * * * *